(12) United States Patent
Murata (10) Patent No.: US 12,096,613 B2
(45) Date of Patent: Sep. 17, 2024

(54) APPARATUSES AND METHODS OF CONTROLLING HYDROGEN SUPPLY IN MEMORY DEVICE (71) Applicant: Micron Technology, Inc., Boise, ID (US)

(72) Inventor: Naokazu Murata, Hiroshima (JP)

(73) Assignee: Micron Technology, Inc., Boise, ID (US)

(*) Notice: Subject to any disclaimer, the term of this patent is extended or adjusted under 35 U.S.C. 154(b) by 138 days.

(21) Appl. No.: 17/510,046

(22) Filed: Oct. 25, 2021

(65) Prior Publication Data
US 2023/0132317 A1 Apr. 27, 2023

(51) Int. Cl.
H10B 12/00 (2023.01)
(52) U.S. Cl.
CPC ........... H10B 12/34 (2023.02); H10B 12/053 (2023.02); H10B 12/315 (2023.02); H10B 12/50 (2023.02)
(58) Field of Classification Search
CPC ......... H01L 21/76814; H01L 21/76826; H01L 21/76831; H01L 21/76834; H01L 21/76843; H01L 23/485; H01L 23/5226; H01L 23/53238; H01L 23/53266; H01L 23/53295; H01L 28/57; H01L 28/60; H10B 12/0335; H10B 12/053; H10B 12/31; H10B 12/315; H10B 12/34; H10B 12/50
See application file for complete search history.

(56) References Cited

U.S. PATENT DOCUMENTS

| 2003/0006439 A1 | 1/2003 | Bailey |
| 2003/0132470 A1 | 7/2003 | Joshi et al. |
| 2005/0012126 A1 | 1/2005 | Udayakumar et al. |
| 2012/0149189 A1 | 6/2012 | Basim et al. |
| 2020/0083448 A1* | 3/2020 | Cho ..................... H01L 21/3003 |
| 2021/0408007 A1 | 12/2021 | Ishigami et al. |

FOREIGN PATENT DOCUMENTS

JP 2001015696 A 1/2001

OTHER PUBLICATIONS

Long et al., "Study on the properties of silicon-nitride thin films deposited by PECVD", SID Symposium Digest of Tech. Papers, vol. 52, Issue 1, pp. 1194-1195 (Year: 2021).*
"International Search Report and Written Opinion for PCT/US2022/077929, mailed on Feb. 7, 2023".
"PCT Appl. As Filed under PCT/US22/77929, filed Oct. 11, 2022".

* cited by examiner

Primary Examiner — Meiya Li
(74) Attorney, Agent, or Firm — Dorsey & Whitney LLP (57) ABSTRACT

Apparatuses and methods for controlling hydrogen diffusion to a substrate in manufacturing memory devices are described. An example apparatus includes: a substrate; an active region in the substrate; at least one first conductive material above the active region; a hydrogen source layer on the at least one first conductive material, the hydrogen source layer including hydrogen atoms and/or molecules and the hydrogen source layer configured to release the hydrogen atoms and/or molecules; a hydrogen diffusion barrier layer on the conductive layer; and at least one second conductive material above the hydrogen diffusion barrier layer, the at least one second conductive material coupled to the at least one first conductive material. The at least one first conductive material has hydrogen diffusion properties. The (Continued)

hydrogen diffusion barrier layer has hydrogen barrier properties.

21 Claims, 9 Drawing Sheets

APPARATUSES AND METHODS OF CONTROLLING HYDROGEN SUPPLY IN MEMORY DEVICE

BACKGROUND

High data reliability, high speed of memory access, lower power consumption and reduced chip size are features that are demanded from semiconductor memory. Recently in semiconductor memory devices such as dynamic random access memories (DRAMs), static RAMs (SRAMs), flash memories, increased memory capacity has been desired.

Memory cells of memory devices can experience defects leading to errors and/or failures. Some electrically active defects in active regions in a substrate are considered to be major factors of leakage charges between memory cells, degradation of memory operations (e.g., refresh operations) and the row hammer effect. Hydrogenation of the substrate may deactivate the defects by passivating dangling bonds of silicon in the substrate by hydrogen atoms. Thus, structures or methods that provide hydrogen to the active regions in the substrate while suppressing excess hydrogen to upper layers are desired.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments. Embodiments of the present disclosure will be described with reference to FIG. 1A to FIG. 9B. The following description uses a dynamic random-access memory (DRAM) as an illustrative example of a semiconductor device. However, the present disclosure is not limited to DRAM or other memory semiconductor devices and may be utilized in other examples of semiconductor devices.

Figure 1A:
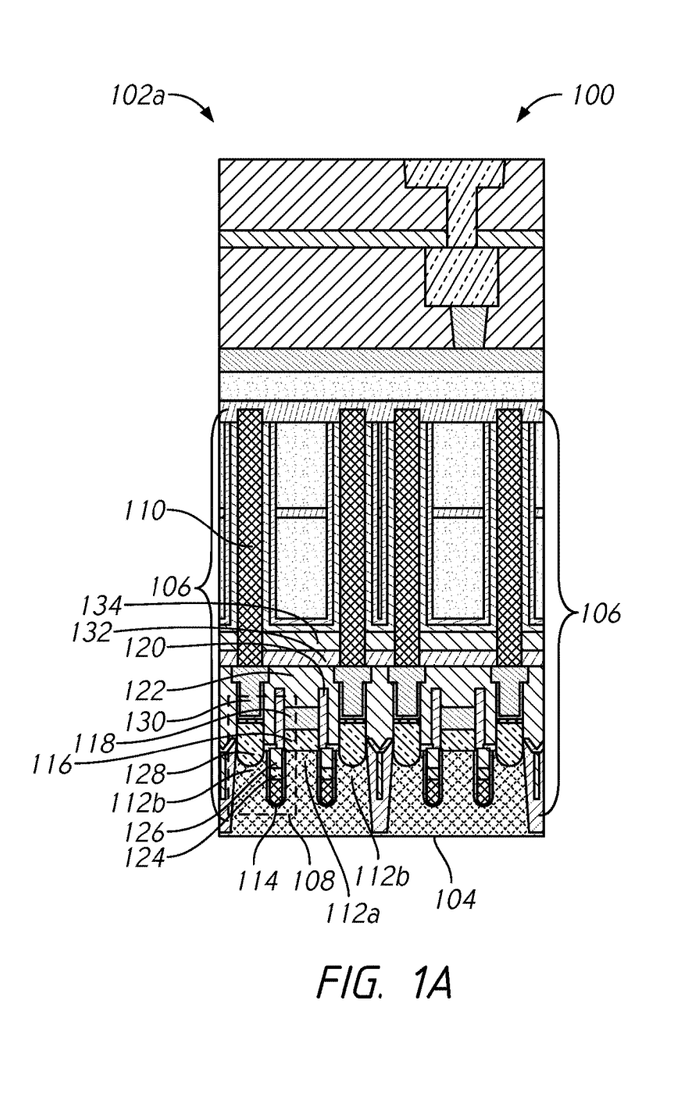
FIG. 1A is a diagram of a vertical cross-sectional view of a structure of a portion of a semiconductor device in accordance with an embodiment of the present disclosure.
Figure 1B:
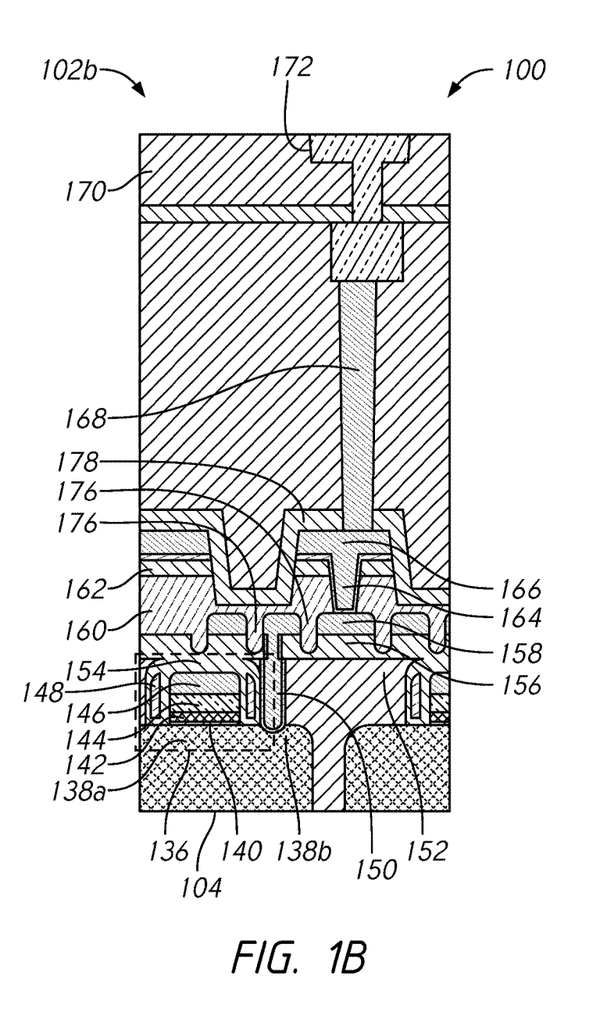
FIG. 1B is a diagram of a vertical cross-sectional view of a structure of another portion of the semiconductor device in accordance with the embodiment of FIG. 1A.

FIG. 1A is a diagram of a vertical cross-sectional view of a structure of a portion 102a of a semiconductor device 100 in accordance with an embodiment of the present disclosure. FIG. 1B is a diagram of a vertical cross-sectional view of a structure of another portion 102b of the semiconductor device 100 in accordance with the embodiment of FIG. 1A. The semiconductor device 100 may include a substrate 104. In the following description, the position "above" is oriented with the substrate 104 at a bottom of the semiconductor device 100. The semiconductor device 100 may be an apparatus including portions 102a and 102b fabricated in a front-end-of-line (FEOL) above the substrate 104. In some embodiments, the substrate 104 may include semiconductive material, such as doped monocrystalline and/or polycrystalline silicon.

The portion 102a may be in a memory array region (not shown) and the portion 102a may include one or more memory cells 106. Each memory cell 106 may be disposed on the substrate 104. Each memory cell 106 may include a transistor 108 disposed on the substrate 104 and a capacitor 110 coupled to the transistor 108. The transistor 108 may include active regions 112a and 112b that are doped regions in the substrate 104. In some embodiments, the active region 112a may be a source region and the active region 112b may be a drain region.

The transistor 108 may be coupled to a bit line 118 above the active region 112a and a word line 114 in the substrate 104. In some embodiments, the bit line 118 may be disposed on a bit line contact 116 on the active region 112a. The bit line contact 116 may couple the active region 112a to the bit line 118. In some embodiments, the bit line contact 116 may include polycrystalline silicon (poly-Si). The bit line 118 may include tungsten (W). In some embodiments, dielectric material 120 may be disposed on sides of the bit line contact 116 and the bit line 118. Another dielectric material 122 may be disposed on the bit line 118 to further cover the bit line 118 and the dielectric material 120. The dielectric material 120 may include metal oxide, for example, silicon dioxide ($SiO_2$). The dielectric material 122 may include, for example, silicon nitride ($Si_3N_4$). The word line 114 may be adjacent to the active regions 112a and 112b. Conductive material 124 may be disposed on the word line 114, and dielectric material 126 may be disposed on the conductive material 124. In some embodiments, the word line 114 may include, for example, titanium nitride (TiN), the conductive material 124 may include polycrystalline silicon (poly-Si), and the dielectric material 126 may include silicon nitride ($Si_3N_4$), for example.

A hydrogen source layer 132 may be disposed above the dielectric material 122. The hydrogen source layer 132 may store hydrogen atoms or molecules. The hydrogen source layer 132 may release at least some of the hydrogen atoms and/or molecules during subsequent thermal processes of the fabrication. In some embodiments, the hydrogen source layer 132 may include, for example, hydrogen-rich silicon nitride ($Si_xN_yH_z$) or hydrogen alloy. In some embodiments, dielectric material 134 may be disposed above the hydrogen source layer 132.

The capacitor 110 may be disposed above the active region 112b. In some embodiments, conductive material 128 may be disposed on the active region 112b, a capacitor contact 130 may be disposed on the conductive material 128. The hydrogen source layer 132 is on the capacitor contact 130. The capacitor 110 may be disposed on the capacitor contact 130 and through the hydrogen source layer 132 and the dielectric material 134. The conductive material 128 and the capacitor contact 130 may couple the capacitor 110 to the active region 112b. Furthermore, the capacitor contact 130 and the conductive material 128 under the capacitor contact 130 may have hydrogen diffusion properties. For example, hydrogen atoms and/or molecules may diffuse into and through the capacitor contact 130 and the conductive material 128 under the capacitor contact 130. In some embodiments, hydrogen molecules/atoms may diffuse through grain boundaries of the conductive material 128 and the capacitor contact 130 containing metal, such as copper (Cu), aluminum (Al), tungsten (W) and polycrystalline silicon (poly-Si). In some embodiments, hydrogen molecules/atoms may diffuse through interfaces of the substrate 104, the conductive material 128 and the capacitor contact 130. The dielectric material 120, 122 and 126 may be between the bit line 118, the word line 114 and the capacitor contact 130 to insulate the bit line 118, the word line 114 and the capacitor contact 130 from one another. In some embodiments, the conductive material 128 may include polycrystalline silicon (poly-Si). The capacitor contact 130 may include tungsten (W). The capacitor contact 130 may be coated with conductive material that is harder than conductive material of the capacitor contact 130, such as titanium nitride (TiN). The capacitor 110 may include metal oxide, for example, silicon dioxide ($SiO_2$). The dielectric material 122 may include, for example, silicon nitride ($Si_3N_4$).

The portion 102b may be in a peripheral region (not shown) and the portion 102b may include peripheral circuits, including one or more transistors 136 disposed on the substrate 104. The transistor 136 may include active region 138a and 138b that are doped regions in the substrate 104. In some embodiments, the active region 138a may be a source region and the active region 138b may be a drain region. The one or more transistors 136 may be separated by an isolation region 152, such as shallow trench isolation.

Each transistor 136 may include a line 146 above the active region 138a and a contact 150 above the active region 138b. In some embodiments, the line 146 may be disposed on conductive material 144 that is on another conductive material 142 above the active region 138a. The conductive material 144 may couple the line 146 to the conductive material 142 that is close to the active region 138a with intervention of a thin layer of the dielectric material 140. In some embodiments, each transistor 136 may further include dielectric material 140 on the active region 138a and under the another conductive material 142. In some embodiments, dielectric material 148 may be disposed on sides of the conductive materials 142 and 144 and the line 146. Another dielectric material 154 may be disposed on the line 146 to further cover the line 146 and the dielectric material 148. The dielectric materials 148 and 154 between the contact 150 and continued sides of the conductive materials 142 and 144 and the line 146 may insulate the line 146 from the contact 150. In some embodiments, the conductive material 142 may include titanium nitride (TiN), and the conductive material 144 may include polycrystalline silicon (poly-Si). The line 146 and the contact 150 may include tungsten (W). In some embodiments, the contact 150 may have hydrogen diffusion properties. For example, hydrogen atoms and/or molecules may diffuse into and through the contact 150. In some embodiments, hydrogen molecules/atoms may diffuse through grain boundaries of the contact 150 containing metal, such as copper (Cu), aluminum (Al), tungsten (W) and polycrystalline silicon (poly-Si). In some embodiments, hydrogen molecules/atoms may diffuse through interfaces of the substrate 104 and the contact 150. In some embodiments, the contact 150 may be coated with conductive material that is harder than conductive material of the contact 150, such as titanium nitride (TiN). The dielectric material 148 may include metal oxide, for example, silicon dioxide ($SiO_2$). The dielectric material 154 may include, for example, silicon nitride ($Si_3N_4$).

Another dielectric material 156 may be disposed on the dielectric material 154 and the isolation region 152, and conductive material 158 may be disposed. In some embodiments, some portions of the dielectric material 156 and the conductive material 158 may be separated from the other portions of the dielectric material 156 and the conductive material 158. In some embodiments, a portion of the conductive material 158 may be disposed on the contact 150 that may be disposed through the isolation region 152 and the dielectric material 156. In some embodiments, the dielectric material 156 may include, for example, silicon nitride ($Si_3N_4$) and the conductive material 154 may include tungsten (W).

A hydrogen source layer 160 may be disposed above the dielectric material 156 and the conductive material 158. In some embodiments, the hydrogen source layer 160 and the hydrogen diffusion barrier layer 162 may be fabricated by different processes to have different physical properties at some point during fabrication. In some embodiment, the hydrogen source layer 160 and the hydrogen diffusion barrier layer 162 may be dielectric layers. In some embodiment, the hydrogen source layer 160 and the hydrogen diffusion barrier layer 162 may include similar chemical elements, such as silicon nitride having different physical properties due to the different process. The hydrogen source layer 160 may release hydrogen atoms and/or molecules during subsequent thermal processes of the fabrication. In some embodiments, the hydrogen source layer 160 may include, for example, hydrogen-rich silicon nitride ($Si_xN_yH_z$) or hydrogen alloy. In some embodiments, the hydrogen source layer 160 may include columns 176 through the dielectric material 156 and the conductive material 158.

A hydrogen diffusion barrier layer 162 may be disposed above the dielectric material 156. The hydrogen diffusion barrier layer 162 may have hydrogen barrier properties. For example, the hydrogen diffusion barrier layer 162 may include a nearly perfect crystal of silicon nitride ($Si_3N_4$), metal which may absorb hydrogen, such as titanium (Ti) and/or aluminum oxide ($Al_2O_3$) that may release hydrogen in the atmosphere during thermal annealing. In some embodiments, the nearly perfect crystal may be formed by an atomic layer deposition (ALD) at a relatively high temperature (approximately 450° C. or higher, around 550° C.), the silane or ammonia gas may react completely with silicon.

Figure 5A:
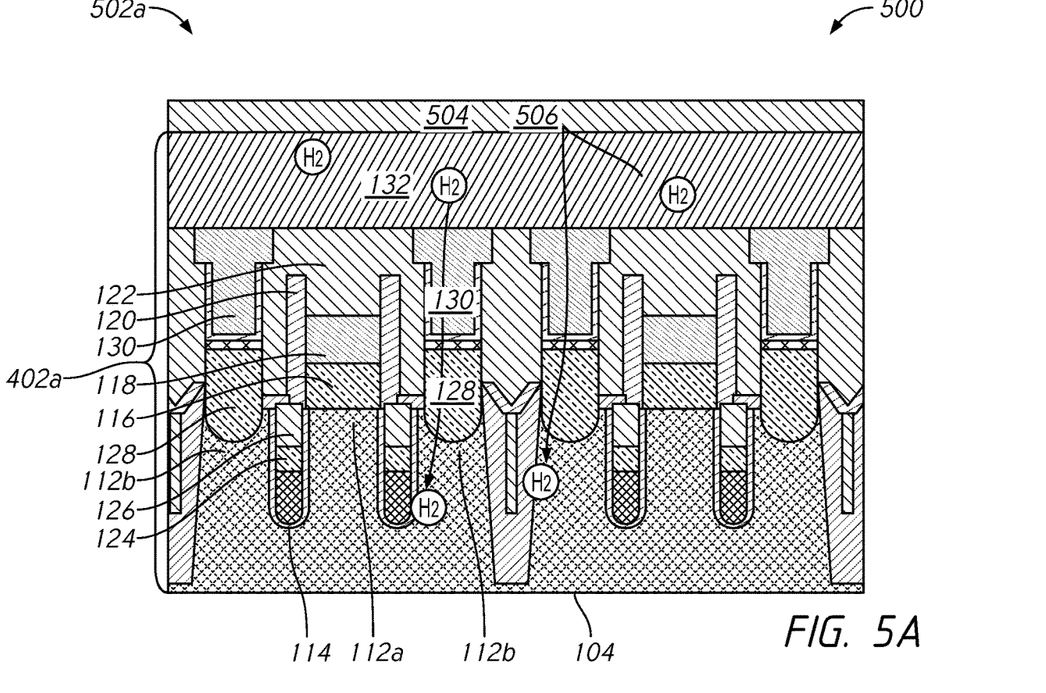
FIG. 5A is a diagram of a vertical cross-sectional view of a structure of a portion of a semiconductor device in accordance with an embodiment of the present disclosure.

In the portion 502a of FIG. 5A, the hydrogen source layer 132 may release hydrogen atoms and/or molecules responsive to the relatively high temperature of the ALD. The capacitor contact 130 may diffuse some of the hydrogen atoms and/or molecules released from the hydrogen source layer 132 to the conductive material 128. The conductive material 128 may diffuse some of the hydrogen atoms and/or molecules from the capacitor contact 130 to the active region 112b. Thus some of the hydrogen atoms and/or molecules released from the hydrogen source layer 132 may be provided to the interface of the substrate 104 in the active region 112b and passivate dangling bonds of silicon in the substrate 104. Some of the hydrogen atoms and/or molecules released from the hydrogen source layer 132 may reach the hydrogen diffusion barrier layer 506. The hydrogen diffusion barrier layer 506 may prevent diffusion of the hydrogen atoms and/or molecules through the hydrogen diffusion barrier layer 506. Thus, hydrogen atoms and/or molecules may be effectively diffused towards the active region 112b while components above the hydrogen diffusion barrier layer 506 may not be affected by hydrogen diffusion.

With reference to FIG. 1B, a via 164 may be disposed through the hydrogen source layer 160 and the hydrogen diffusion barrier layer 162. The via 164 may be formed on a portion of the conductive material 158. An interconnect 166 may be disposed on the via 164. In some embodiments, the via 164 and the interconnect 166 may be formed in the same process. In some embodiments, the via 164 and the interconnect 166 may include tungsten (W). The via 164 and the interconnect 166 may be coated by one or more barrier film including transition metal or transition metal nitride. For example, the transition metal may be any one of, for example, yttrium (Y), titanium (Ti), zirconium (Zr), hafnium (Hf), niobium (Nb), or tantalum (Ta). Dielectric material 178 may be disposed above the hydrogen source layer 160 and the interconnect 166. In some embodiments, the dielectric materials 134 and 178 may include silicon nitride ($Si_3N_4$). In some embodiments, the dielectric materials 134 and 178 may be formed concurrently. Another via 168 may be formed through the dielectric material 178 on the interconnect 166. The via 168 may couple the transistor 136 to an interconnect 172 disposed in a dielectric layer 170 in a back-end-of-line (BEOL).

The following describes methods of forming apparatuses, such as the semiconductor device 100 according to the embodiments with reference to FIG. 2A to FIG. 9B. The dimensions and the ratios of dimensions of each portion in each drawing do not necessarily coincide with the dimensions and the ratios of dimensions of the actual semiconductor device.

Figure 2A:
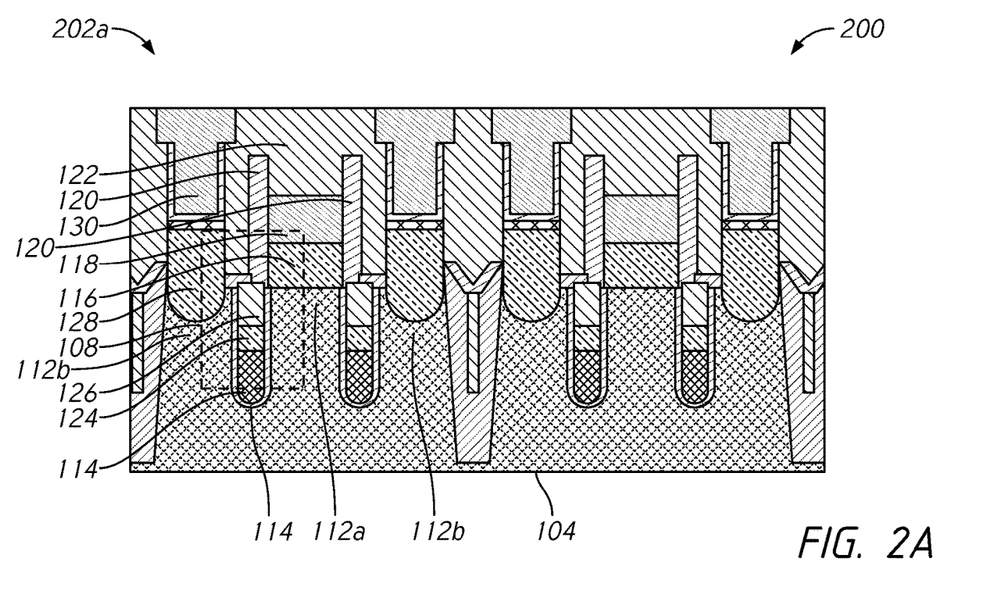
FIG. 2A is a diagram of a vertical cross-sectional view of a structure of a portion of a semiconductor device in accordance with an embodiment of the present disclosure.

FIG. 2A is a diagram of a vertical cross-sectional view of a structure of a portion 202a of a semiconductor device 200 in accordance with an embodiment of the present disclosure. In some embodiments, the portion 202a may be an intermediate structure that is used to fabricate the portion 102a of FIG. 1A. The portion 202a includes a portion of the substrate 104 and the transistor 108 disposed on the substrate 104. In some embodiments, the substrate 104 may include semiconductive material, such as doped monocrystalline and/or polycrystalline silicon. The transistor 108 may include the active regions 112a and 112b in the substrate 104. In some embodiments, the active region 112a may be a source region and the active region 112b may be a drain region. The active regions 112a and 112b may be formed by doping the substrate 104 with different impurities to have different polarities.

The word line 114, the conductive material 124 on the word line 114, and the dielectric material 126 on the conductive material 124 may be deposited in openings in the substrate 104 between the active regions 112a and 112b. In some embodiments, the openings may be created by etching, and doping the substrate 104 with different impurities may be performed after etching. The word line 114, the conductive material 124 on the word line 114, and the dielectric material 126 on the conductive material 124 may be deposited in the openings between the active regions 112a and 112b. In some embodiments, the word line 114 may include, for example, titanium nitride (TiN), the conductive material 124 may include polycrystalline silicon (poly-Si), and the dielectric material 126 may include silicon nitride ($Si_3N_4$), for example.

The bit line contact 116 may be formed on the active region 112a, and the bit line 118 may be formed on the bit line contact 116. The conductive material 128 may be formed on the active region 112b and the capacitor contact 130 may be formed on the active region 112b. In some embodiments, the conductive material 128 and the capacitor contact 130 may include materials having hydrogen diffusion properties. In some embodiments, hydrogen molecules/atoms may diffuse through grain boundaries of the conductive material 128 and the capacitor contact 130 containing metal, such as copper (Cu), aluminum (Al), tungsten (W) and polycrystalline silicon (poly-Si). In some embodiments, hydrogen molecules/atoms may diffuse through interfaces of the substrate 104 and the conductive material 128 and the capacitor contact 130. In some embodiments, hydrogen molecules/atoms may diffuse through atomic bonds, such as a silicon-oxygen bond Si—O of silicon oxide ($SiO_2$). In some embodiments, the bit line contact 116 and the conductive material 128 may be formed concurrently by depositing first common conductive material, such as polycrystalline silicon (poly-Si). The bit line 118 and at least a lower portion of the capacitor contact 130 may be formed by depositing second common conductive material, such as tungsten (W). Alternatively, at least the lower portion of the capacitor contact 130 may be formed using the damascene process. In the damascene process, a barrier layer including conductive material having a harder property than the capacitor contact 130, such as titanium nitride (TiN), may be formed to cover a surface of the opening and the lower portion of the capacitor contact 130 may be formed in the opening.

In some embodiments, dielectric material 120 may be disposed on sides of the bit line contact 116 and the bit line 118. Another dielectric material 122 may be disposed on the bit line 118 to further cover the bit line 118 and the dielectric material 120. In some embodiments, an opening may be provided by etching between the bit line 118 and the capacitor contact 130, and further between the bit line contact 116 and the conductive material 128 and the dielectric materials 120 and 122 may be filled. Alternatively, the dielectric materials 120 and 122 may be deposited, an opening may be created above the active regions 112a and 112b, the first conductive material may be deposited to form the bit line contact 116 and the conductive material 128, and the second conductive material may be deposited to form the bit line 118 and the capacitor contact 130. In some embodiments, a lower portion of the capacitor contact 130 and the lower portion of the dielectric material 122 may be formed and a top surface of the lower portions of the capacitor contact 130 and the dielectric material 122 may be planarized. An upper portion of the capacitor contact 130 may be formed on the lower portion of the capacitor contact 130, and an upper portion of the dielectric material 122 may be formed on the lower portion of the dielectric material 122. The dielectric material 120 may include metal oxide, for example, silicon dioxide ($SiO_2$). The dielectric material 122 may include, for example, silicon nitride ($Si_3N_4$).

Figure 2B:
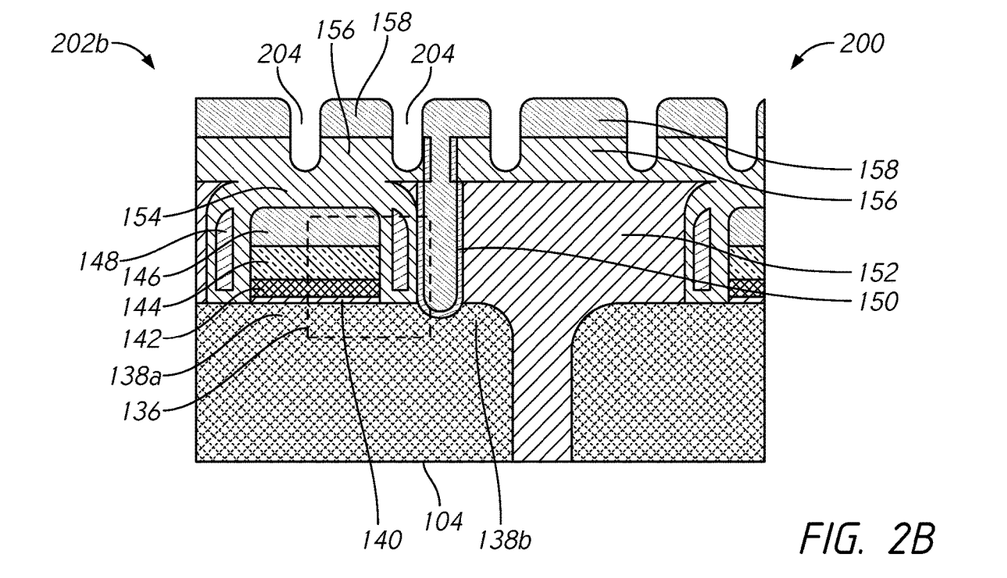
FIG. 2B is a diagram of a vertical cross-sectional view of a structure of another portion of the semiconductor device in accordance with the embodiment of FIG. 2A.

FIG. 2B is a diagram of a vertical cross-sectional view of a structure of another portion 202b of the semiconductor device 200 in accordance with the embodiment of FIG. 2A. In some embodiments, the portion 202b may be an intermediate structure that is used to fabricate the portion 102b of FIG. 1B. The portion 202b includes a portion of the substrate 104 and the transistor 136 disposed on the portion the substrate 104. The transistor 136 may include the active regions 138a and 138b in the portion of the substrate 104. In some embodiments, the active region 138a may be one of a source region and a drain region and the active region 138b may be the other of the source region and the drain region. The active regions 138a and 138b may be formed by doping the substrate 104 with different impurities to have different polarities.

The dielectric material 140 may be formed on the active region 138a. The conductive material 142 may be formed on the dielectric material 140. The conductive material 144 may be formed on the conductive material 142, and the line 146 may be formed on the conductive material 144. In some embodiments, the dielectric material 140 may include, for example, silicon dioxide ($SiO_2$). The conductive material 142 may include, for example, titanium nitride (TiN), the conductive material 144 may include polycrystalline silicon (poly-Si), and the line 146 may be formed by depositing conductive material, such as tungsten (W). In some embodiments, dielectric material 148 may be disposed on sides of the conductive materials 142, 144, and the line 146. Another dielectric material 154 may be disposed on the line 146 to further cover the line 146, conductive materials 142, 144, and the dielectric material 148.

The contact 150 may be formed on the active region 138b. In some embodiments, the contact 150 may have hydrogen diffusion properties. In some embodiments, hydrogen molecules/atoms may diffuse through grain boundaries of the contact 150 containing metal, such as copper (Cu), aluminum (Al), tungsten (W) and polycrystalline silicon (poly-Si). In some embodiments, hydrogen molecules/atoms may diffuse through interfaces of the substrate 104 and the contact 150. In some embodiments, the contact 150 and the line 146 may be formed by depositing common conductive material, such as tungsten (W). In some embodiments, the isolation region 152 may be formed first by depositing the dielectric material, such as silicon dioxide ($SiO_2$), openings may be provided in the isolation region 152 by etching, and the transistor 136 and a lower portion of the contact 150 may be formed in the isolation region 152. In some embodiments, at least the lower portion of the contact 150 may be formed using the damascene process. In the damascene process, a barrier layer including conductive material having a harder property than the contact 150, such as titanium nitride (TiN), may be formed to cover a surface of the opening for the lower portion of the contact 150, and the lower portion of the contact 150 may be formed in the opening.

The dielectric material 156 may be formed on the dielectric material 154 and the isolation region 152. The dielectric material 156 may include, for example, silicon nitride ($Si_3N_4$). Another opening may be formed through the dielectric material 156 and an upper portion of the contact 150 may be formed in the opening through the dielectric material 156. In some embodiments, the upper portion of the contact may be formed using the damascene process described above. The conductive material 158 may be formed on the dielectric material 156 and the contact 150. In some embodiments, the conductive material 158 may have hydrogen diffusion properties. For example, hydrogen atoms and/or molecules may diffuse into and through the conductive material 158. In some embodiments, hydrogen molecules/atoms may diffuse through grain boundaries of the conductive material 158 containing metal, such as copper (Cu), aluminum (Al), tungsten (W) and polycrystalline silicon (poly-Si). The conductive material 158 may include, for example, tungsten (W). Openings 204 may be formed by dry etching through the conductive material 158 and the dielectric material 156.

Figure 3A:
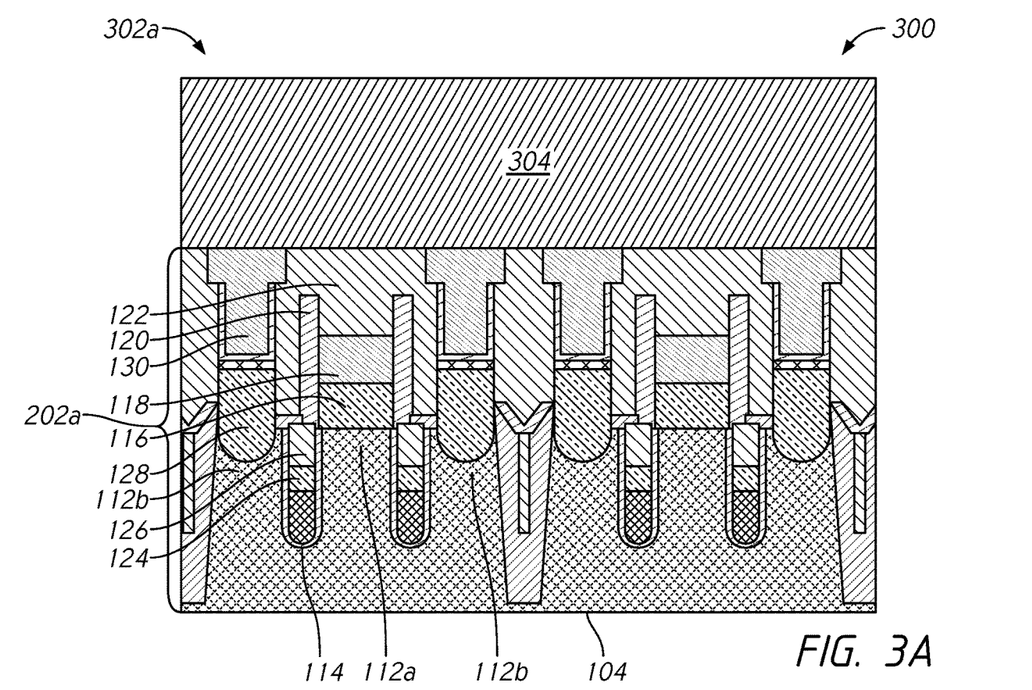
FIG. 3A is a diagram of a vertical cross-sectional view of a structure of a portion of a semiconductor device in accordance with an embodiment of the present disclosure.

FIG. 3A is a diagram of a vertical cross-sectional view of a structure of a portion 302a of a semiconductor device 300 in accordance with an embodiment of the present disclosure. In some embodiments, the portion 302a in FIG. 3A may be fabricated by performing one or more fabrication processes on the portion 202a in FIG. 2A. In some embodiments, the portion 302a may be an intermediate structure that is used to fabricate the portion 102a of FIG. 1A.

Figure 3B:
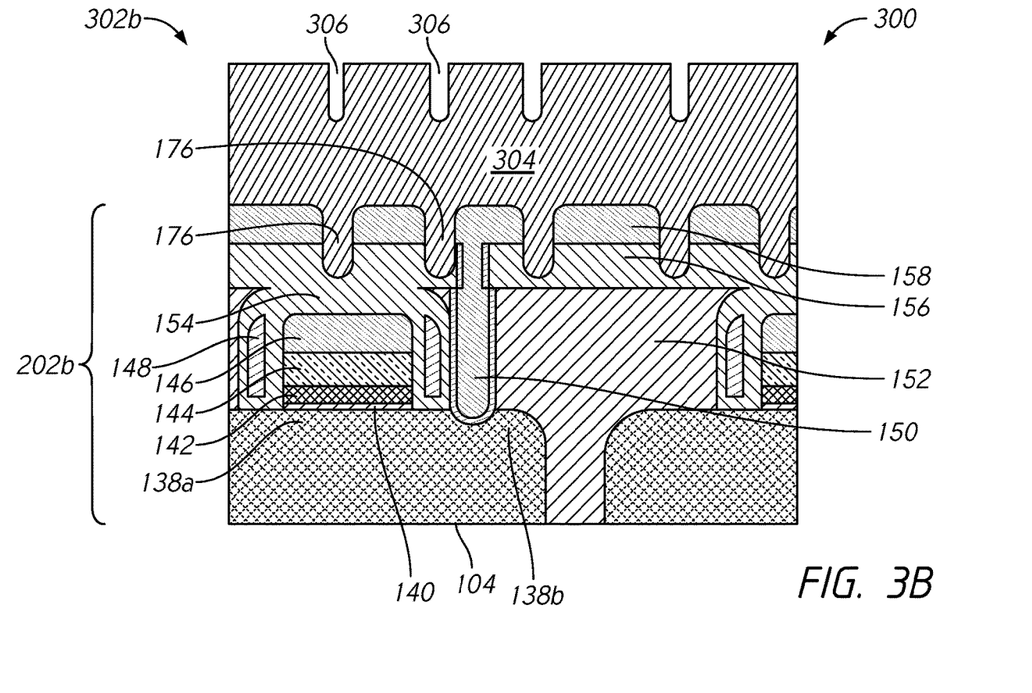
FIG. 3B is a diagram of a vertical cross-sectional view of a structure of another portion of the semiconductor device in accordance with the embodiment of FIG. 3A.

FIG. 3B is a diagram of a vertical cross-sectional view of a structure of a portion 302b of the semiconductor device 300 in accordance with the embodiment of FIG. 3A. In some embodiments, the portion 302b in FIG. 3B may be fabricated by performing one or more fabrication processes on the portion 202b in FIG. 2B. In some embodiments, the portion 302b may be an intermediate structure that is used to fabricate the portion 102b of FIG. 1B.

Dielectric material 304 may be deposited over the memory array region (not shown) and the peripheral region (not shown) of the semiconductor device 200. The dielectric material 304 may contain hydrogen atoms or molecules that may be released during subsequent thermal processes of the fabrication. In some embodiments, the dielectric material 304 may include, for example, hydrogen-rich silicon nitride ($Si_xN_yH_z$) or hydrogen alloy. In some embodiments, the hydrogen-rich silicon nitride ($Si_xN_yH_z$) may be deposited using passivation plasma-enhanced chemical vapor deposition (PECVD). For example, the hydrogen-rich silicon nitride ($Si_xN_yH_z$) deposited using PECVD may have higher concentration of Si—H bonds. Hydrogen compound gaseous species, such as silane ($SiH_4$) and/or ammonia ($NH_3$) may be introduced to form the dielectric material 304. During the PECVD at a relatively low-temperature (approximately between 200° C. and 400° C.), the silane or ammonia gas may not react completely with silicon, thus the reaction may result in composition of $Si_xN_y$ instead of composition $Si_3N_4$ after complete reaction. Dangling bonds of the $Si_xN_y$ may exist as defects and may be passivated by bonding with hydrogen atoms. Thus, the dielectric material 304 may include chemical composition $Si_xN_yH_z$, considered to have more defects and more hydrogen atoms and/or molecules compared with a nearly perfect crystal of $Si_3N_4$ formed by subsequent thermal processes, such as the ALD at a relatively high temperature (approximately 450° C. or higher). The dielectric material 304 may include a portion on the portion 202a of FIG. 2A and another portion on the portion 202b of FIG. 2B. In some embodiments, the portion of dielectric material 304 on the portion 202b may include the columns 176 in the openings 204. The columns 176 may have surfaces closer to the contact 150. Thus, the columns 176 may effectively increase hydrogen atoms and/or molecules to the contact 150 during the fabrication process. The contact 150 may diffuse the hydrogen atoms and/or molecules to the active regions 138a and 138b. In some embodiments, the dielectric material 304 may have a top surface that may be uneven due to openings 306 above the columns 176.

Figure 4A:
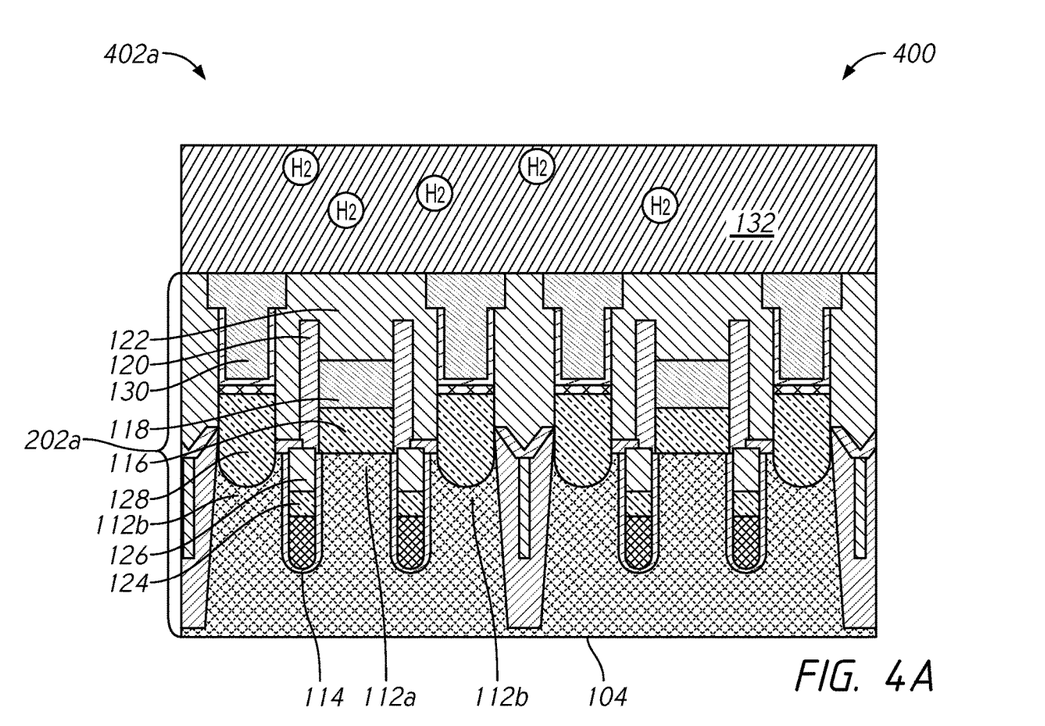
FIG. 4A is a diagram of a vertical cross-sectional view of a structure of a portion of a semiconductor device in accordance with an embodiment of the present disclosure.

FIG. 4A is a diagram of a vertical cross-sectional view of a structure of a portion 402a of a semiconductor device 400 in accordance with an embodiment of the present disclosure. In some embodiments, the portion 402a in FIG. 4A may be fabricated by performing one or more fabrication processes on the portion 302a in FIG. 3A. In some embodiments, the portion 402a may be an intermediate structure that is used to fabricate the portion 102a of FIG. 1A.

Figure 4B:
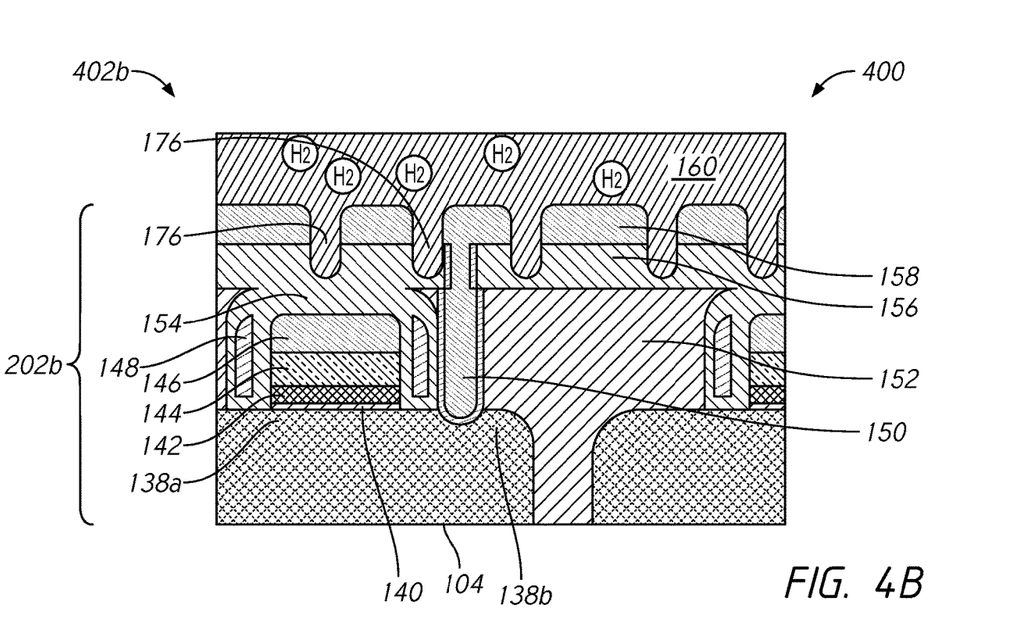
FIG. 4B is a diagram of a vertical cross-sectional view of a structure of another portion of the semiconductor device in accordance with the embodiment of FIG. 4A.

FIG. 4B is a diagram of a vertical cross-sectional view of a structure of a portion 402b of the semiconductor device 400 in accordance with the embodiment of FIG. 4A. In some embodiments, the portion 402b in FIG. 4B may be fabricated by performing one or more fabrication processes on the portion 302b in FIG. 3B. In some embodiments, the portion 402b may be an intermediate structure that is used to fabricate the portion 102b of FIG. 1B.

A top portion of the dielectric material 304 may be removed. In some embodiments, the removal of the top portion of the dielectric material 304 may be performed by chemical-mechanical polishing (CMP). A remained portion of the dielectric material 304 may include the hydrogen source layer 132 on the portion 202a and the hydrogen source layer 160 on the portion 202b. The hydrogen source layers 132 and 160 may contain hydrogen atoms or molecules that may be released during the fabrication.

FIG. 5A is a diagram of a vertical cross-sectional view of a structure of a portion 502a of a semiconductor device 500 in accordance with an embodiment of the present disclosure. In some embodiments, the portion 502a in FIG. 5A may be fabricated by performing one or more fabrication processes on the portion 402a in FIG. 4A. In some embodiments, the portion 502a may be an intermediate structure that is used to fabricate the portion 102a of FIG. 1A.

Figure 5B:
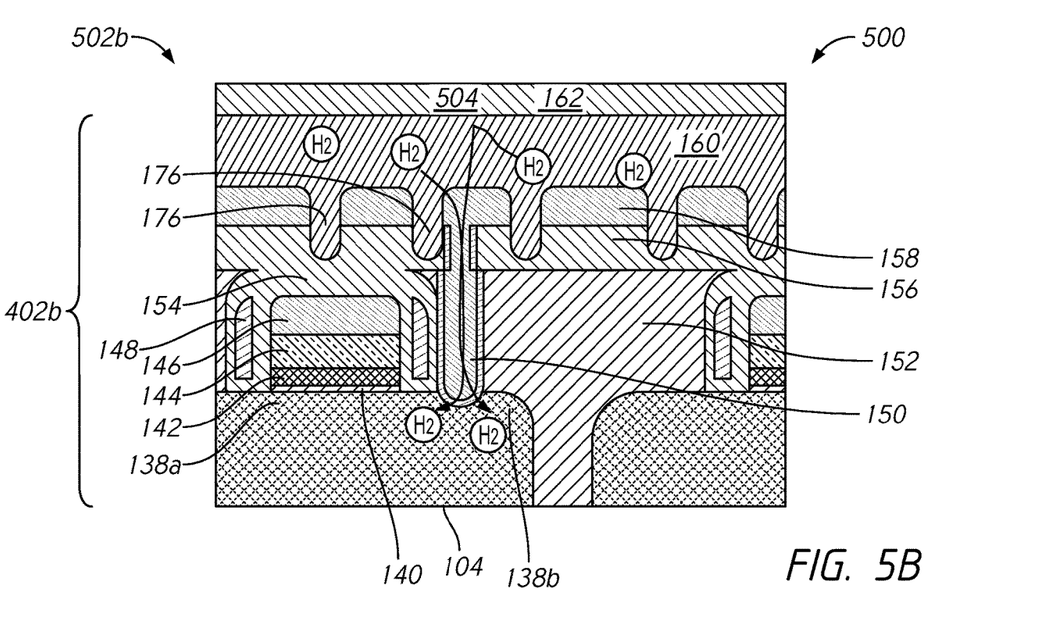
FIG. 5B is a diagram of a vertical cross-sectional view of a structure of another portion of the semiconductor device in accordance with the embodiment of FIG. 5A.

FIG. 5B is a diagram of a vertical cross-sectional view of a structure of a portion 502b of the semiconductor device 500 in accordance with the embodiment of FIG. 5A. In some embodiments, the portion 502b in FIG. 5B may be fabricated by performing one or more fabrication processes on the portion 402b in FIG. 4B. In some embodiments, the portion 502b may be an intermediate structure that is used to fabricate the portion 102b of FIG. 1B.

Dielectric material 504 may be deposited over the memory array region (not shown) and the peripheral region (not shown) of the semiconductor device 400. The dielectric material 504 may have may have hydrogen barrier properties. The dielectric material 504 may include a hydrogen diffusion barrier layer 506 on the portion 402a of FIG. 4A and the hydrogen diffusion barrier layer 162 on the portion 402b of FIG. 4B. In some embodiments, the dielectric material 504 may be deposited using the ALD. Chlorosilanes as the silicon (Si) source and hydrogen compound gaseous species, such as silane ($SiH_4$) and/or ammonia ($NH_3$) may be introduced to form the dielectric material 504. During the ALD at a relatively high temperature (approximately 450° C. or higher, around 550° C.), the silane or ammonia gas may react completely with silicon, thus a nearly perfect crystal of $Si_3N_4$ may be formed.

In the portion 502a of FIG. 5A, the hydrogen source layer 132 may release hydrogen atoms and/or molecules responsive to the relatively high temperature of the ALD. The capacitor contact 130 may diffuse some of the hydrogen atoms and/or molecules released from the hydrogen source layer 132 to the conductive material 128. The conductive material 128 may diffuse some of the hydrogen atoms and/or molecules from the capacitor contact 130 to the active region 112b. Thus some of the hydrogen atoms and/or molecules released from the hydrogen source layer 132 may be provided to the interface of the substrate 104 in the active region 112b and passivate dangling bonds of silicon in the substrate 104. Some of the hydrogen atoms and/or molecules released from the hydrogen source layer 132 may reach the hydrogen diffusion barrier layer 506. The hydrogen diffusion barrier layer 506 may prevent diffusion of the hydrogen atoms and/or molecules through the hydrogen diffusion barrier layer 506. Thus, hydrogen atoms and/or molecules may be effectively diffused towards the active region 112b while components above the hydrogen diffusion barrier layer 506 may not be affected by hydrogen diffusion.

In the portion 502b of FIG. 5B, the hydrogen source layer 160 may release hydrogen atoms and/or molecules responsive to the relatively high temperature of the ALD. The conductive material 158 may diffuse some of the hydrogen atoms and/or molecules released from the hydrogen source layer 160 to the contact 150. The contact 150 may diffuse some of the hydrogen atoms and/or molecules from the conductive material 158 to the active region 138b. Thus some of the hydrogen atoms and/or molecules released from the hydrogen source layer 160 may be provided to the interface of the substrate 104 in the active regions 138a and 138b and passivate dangling bonds of silicon in the substrate 104. Some of the hydrogen atoms and/or molecules released from the hydrogen source layer 160 may reach the hydrogen diffusion barrier layer 162. The hydrogen diffusion barrier layer 162 may prevent diffusion of the hydrogen atoms and/or molecules through the hydrogen diffusion barrier layer 162. Thus, hydrogen atoms and/or molecules may be effectively diffused towards the active regions 138a and 138b while components above the hydrogen diffusion barrier layer 162 may not be affected by hydrogen diffusion.

Figure 6A:
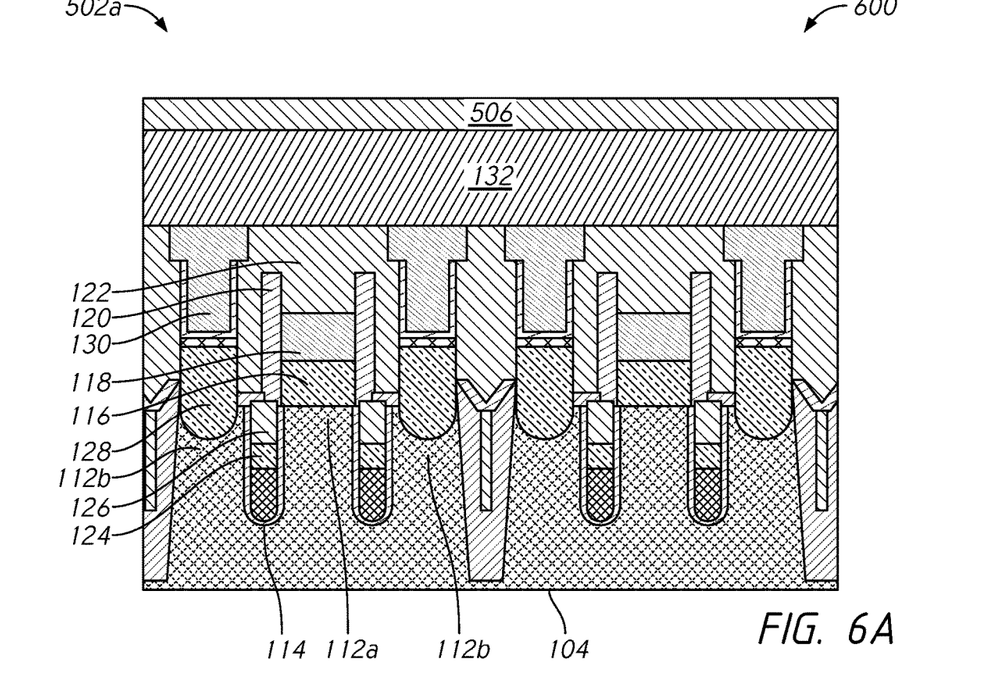
FIG. 6A is a diagram of a vertical cross-sectional view of a structure of a portion of a semiconductor device in accordance with an embodiment of the present disclosure.

FIG. 6A is a diagram of a vertical cross-sectional view of a structure of a portion 502a of a semiconductor device 600 in accordance with an embodiment of the present disclosure. In some embodiments, the portion 502a in FIG. 6A may be the portion 502a in FIG. 5A.

In the portion 502a of FIG. 6A, after the ALD, some of the hydrogen atoms and/or molecules released from the hydrogen source layer 132 have been provided to the interface of the substrate 104 in the active region 112b and passivate dangling bonds of silicon in the substrate 104 may be passivated. In some embodiments, the portion 502a may be kept intact by forming photoresist on a top surface of the portion 502a to cover the portion 502a during the processing of forming the openings 604.

Figure 6B:
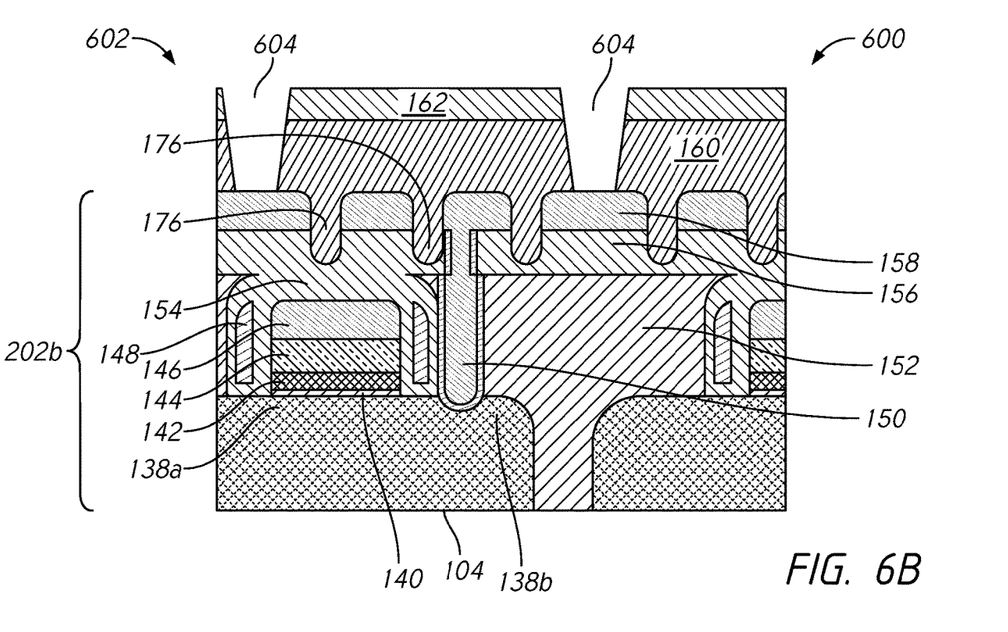
FIG. 6B is a diagram of a vertical cross-sectional view of a structure of another portion of the semiconductor device in accordance with the embodiment of FIG. 6A.

FIG. 6B is a diagram of a vertical cross-sectional view of a structure of a portion 602 of the semiconductor device 600 in accordance with the embodiment of FIG. 6A. In some embodiments, the portion 602 in FIG. 6B may be fabricated by performing one or more fabrication processes on the portion 502b in FIG. 5B. In some embodiments, the portion 602 may be an intermediate structure that is used to fabricate the portion 102b of FIG. 1B.

In the portion 602 of FIG. 6B, the conductive material 158 may be divided into portions by the columns 176. Openings 604 may be formed on some of the portions of the conductive material 158. The bottoms of the openings 604 may expose top surfaces of some of the portions of the conductive material 158. To form the openings 604, portions of the hydrogen source layer 160 and the hydrogen diffusion barrier layer 162 above the top surfaces of some of the portions of the conductive material 158 may be removed. Removing the portions of the hydrogen source layer 160 and the hydrogen diffusion barrier layer 162 may be performed by forming photoresists on the semiconductor device 500 and dry-etching from a portion of a top surface of the portion 502b exposed, uncovered the photoresists. In some embodiments, the portion of the top surface of the portion 502b may be a top surface of the hydrogen diffusion barrier layer 162 to be removed. Then etching through the he hydrogen source layer 160 and the hydrogen diffusion barrier layer 162 may be performed to form the opening 604.

Figure 7A:
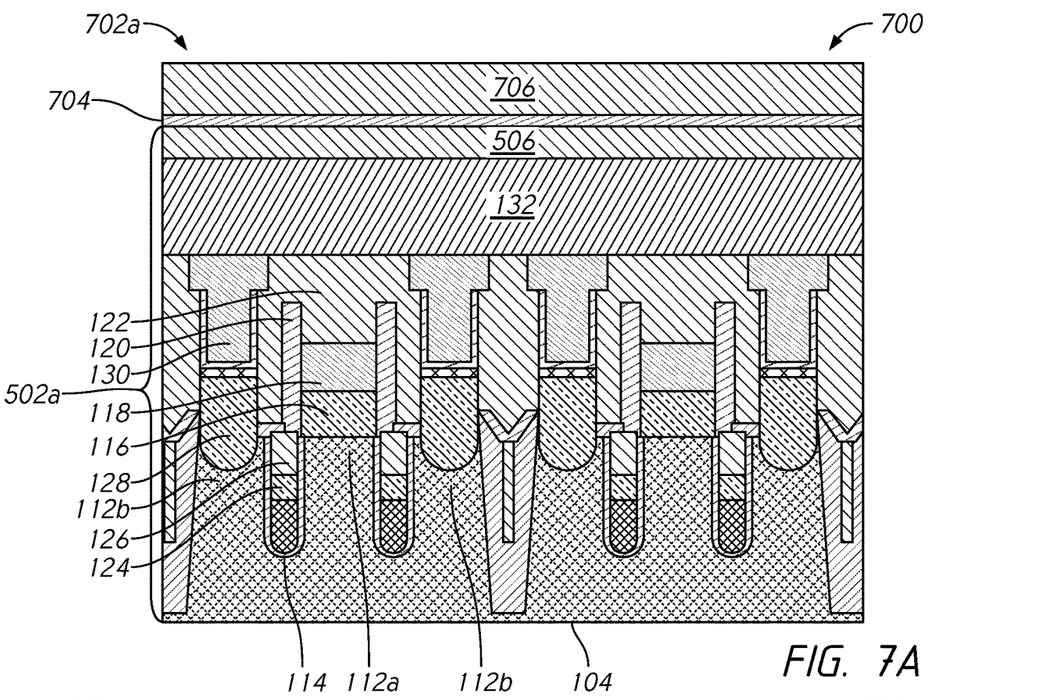
FIG. 7A is a diagram of a vertical cross-sectional view of a structure of a portion of a semiconductor device in accordance with an embodiment of the present disclosure.

FIG. 7A is a diagram of a vertical cross-sectional view of a structure of a portion 702a of a semiconductor device 700 in accordance with an embodiment of the present disclosure. In some embodiments, the portion 702a in FIG. 7A may be fabricated by performing one or more fabrication processes on the portion 502a in FIG. 6A. In some embodiments, the portion 702a may be an intermediate structure that is used to fabricate the portion 102a of FIG. 1A.

Figure 7B:
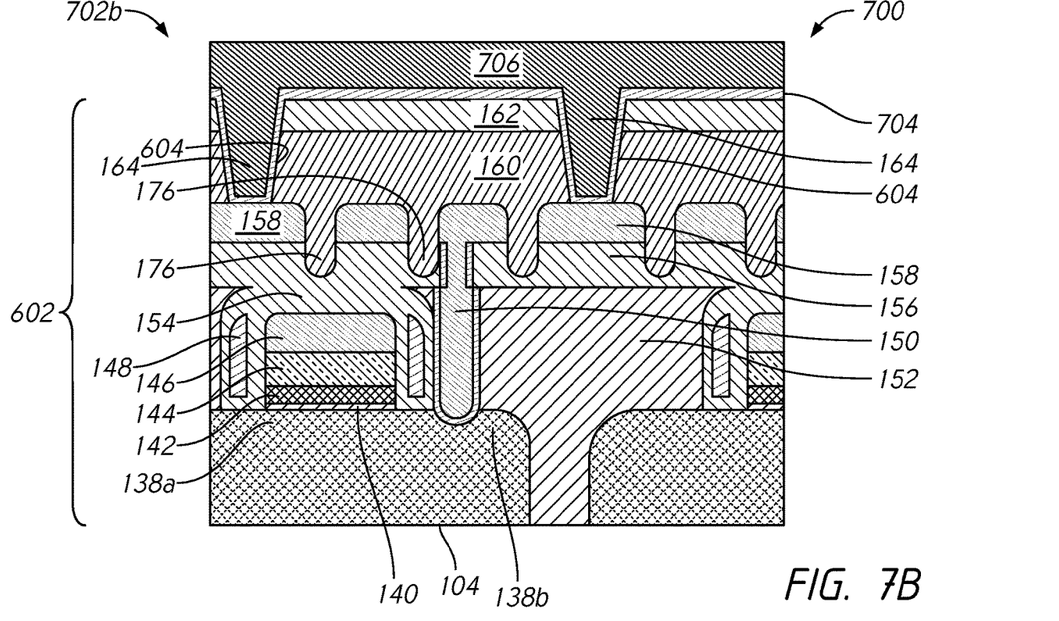
FIG. 7B is a diagram of a vertical cross-sectional view of a structure of another portion of the semiconductor device in accordance with the embodiment of FIG. 7A.

FIG. 7B is a diagram of a vertical cross-sectional view of a structure of a portion 702b of the semiconductor device 700 in accordance with the embodiment of FIG. 7A. In some embodiments, the portion 702b in FIG. 7B may be fabricated by performing one or more fabrication processes on the portion 602 in FIG. 6B. In some embodiments, the portion 702b may be an intermediate structure that is used to fabricate the portion 102b of FIG. 1B.

A barrier layer 704 may be deposited over the memory array region (not shown) and the peripheral region (not shown) of the semiconductor device 600. The barrier layer 704 may cover a top surface of the hydrogen diffusion barrier layer 506 and a top surface of the hydrogen diffusion barrier layer 162. The barrier layer 704 may further cover side walls of the hydrogen source layer 160 and the hydrogen diffusion barrier layer 162 in the openings 604. The barrier layer 704 may also cover the exposed top surfaces the conductive material 158 at the bottoms of the openings 604. In some embodiments, the barrier layer 704 may include titanium nitride (TiN). The barrier layer 704 may be deposited using chemical vapor deposition (CVD).

Conductive material 706 may be deposited on the barrier layer 704 over the memory array region (not shown) and the peripheral region (not shown). The conductive material 706 may fill the openings 604 to form the vias 164 coated by the barrier layer 704 in the opening 604. Thus, the vias 164 may be formed on some of the portions of the conductive material 158. A top surface of the conductive material 706 may be planarized by the CMP, and a lower portion of the conductive material 706 including the vias 164 and a portion above the barrier layer 704 may remain. In some embodiments, conductive material 706 may include chemically stable material, such as tungsten (W).

Figure 8A:
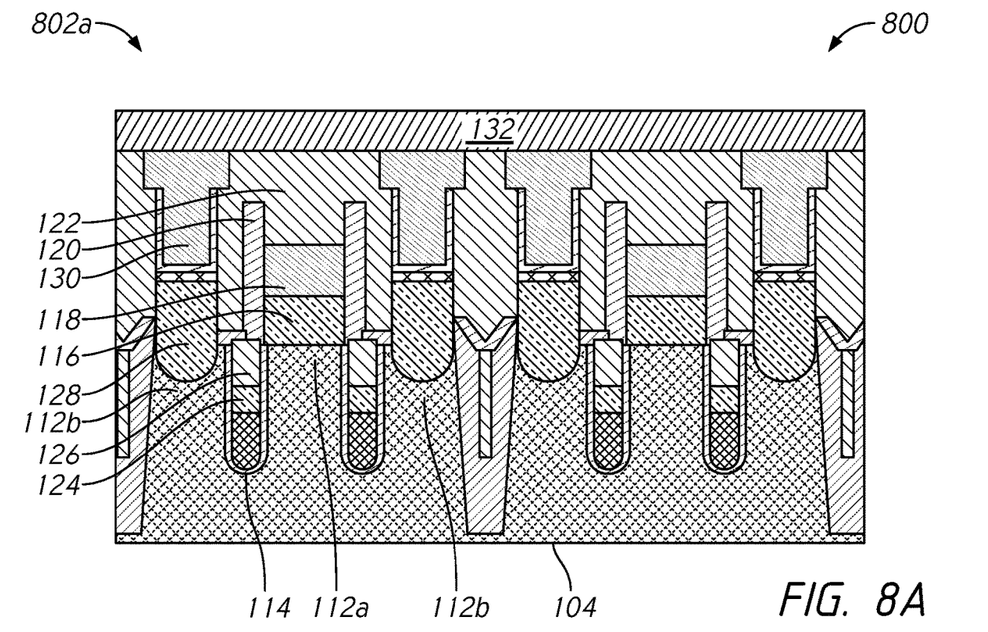
FIG. 8A is a diagram of a vertical cross-sectional view of a structure of a portion of a semiconductor device in accordance with an embodiment of the present disclosure.

FIG. 8A is a diagram of a vertical cross-sectional view of a structure of a portion 802a of a semiconductor device 800 in accordance with an embodiment of the present disclosure. In some embodiments, the portion 802a in FIG. 8A may be fabricated by performing one or more fabrication processes on the portion 702a in FIG. 7A. In some embodiments, the portion 802a may be an intermediate structure that is used to fabricate the portion 102a of FIG. 1A.

Figure 8B:
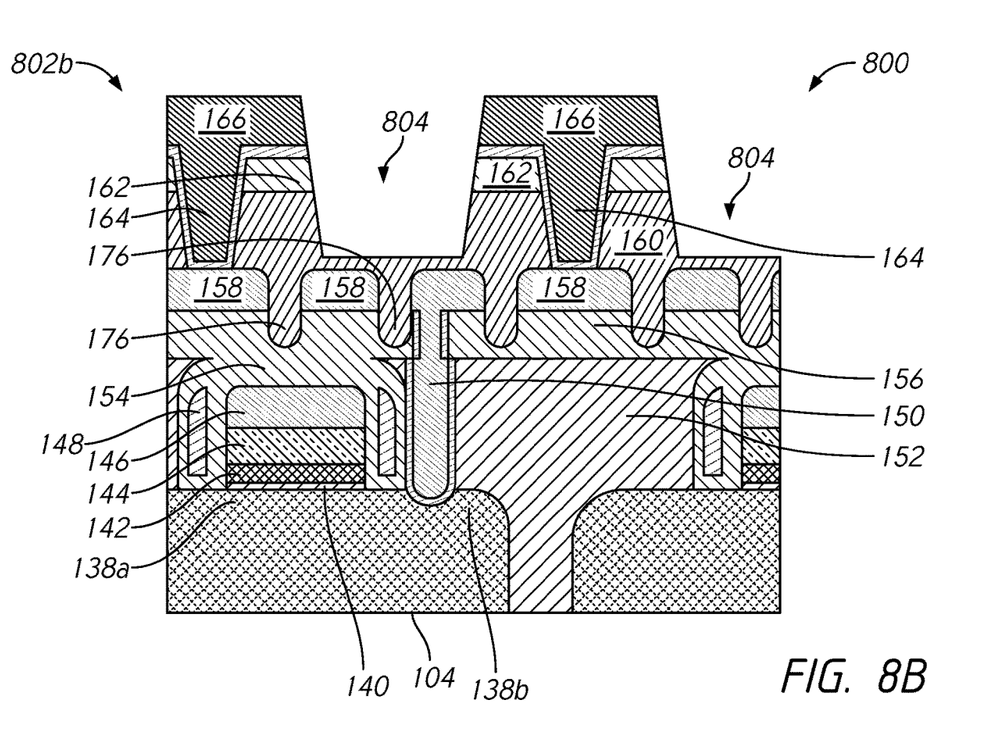
FIG. 8B is a diagram of a vertical cross-sectional view of a structure of another portion of the semiconductor device in accordance with the embodiment of FIG. 8A.

FIG. 8B is a diagram of a vertical cross-sectional view of a structure of a portion 802b of the semiconductor device 800 in accordance with the embodiment of FIG. 8A. In some embodiments, the portion 802b in FIG. 8B may be fabricated by performing one or more fabrication processes on the portion 702b in FIG. 7B. In some embodiments, the portion 802b may be an intermediate structure that is used to fabricate the portion 102b of FIG. 1B.

In the portion 802a, the conductive material 706, the hydrogen diffusion barrier layer 506 and a top portion of the hydrogen source layer 132 may be removed. In the portion 802b, a portion of the conductive material 706, a portion of the hydrogen diffusion barrier layer 162 and an upper portion of the hydrogen source layer 160 between the vias 164 may be removed and openings 804 may be formed between the vias 164 after the removal. In the portion 802b of FIG. 8B, the conductive material 706 may be divided by the openings 804 to form interconnects 166 on the vias 164. Removing the conductive material 706, the hydrogen diffusion barrier layer 506 and the top portion of the hydrogen source layer 132 and the portion of the conductive material 706, the portion of the hydrogen diffusion barrier layer 162 and the upper portion of the hydrogen source layer 160 may be performed by forming photo resists on the semiconductor device 700 and dry-etching a top surface of the semiconductor device 700 exposed between the photoresists. In some embodiments, the interconnects 166 may be protected by masking the top surface of portions of the conductive material 706 to be the interconnects 166 using photoresists during the process of forming the openings 804. Then etching may be performed to form the openings 804. Concurrently with forming the openings 804 by etching, the conductive material 706, the barrier layer 704 and the hydrogen diffusion barrier layer 506 and the top portion of the hydrogen source layer 132 in the portion 702a may also be removed and the portions 802a and 802b may be formed. The interconnects 166 may include conductive material in the conductive material 706, such as tungsten (W).

Figure 9A:
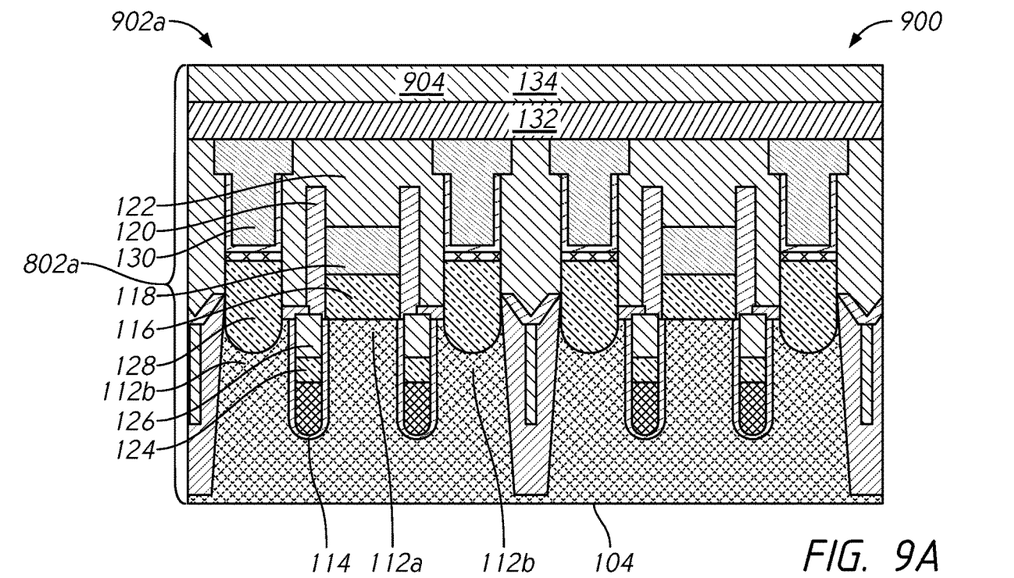
FIG. 9A is a diagram of a vertical cross-sectional view of a structure of a portion of a semiconductor device in accordance with an embodiment of the present disclosure.

FIG. 9A is a diagram of a vertical cross-sectional view of a structure of a portion 902a of a semiconductor device 900 in accordance with an embodiment of the present disclosure. In some embodiments, the portion 902a in FIG. 9A may be fabricated by performing one or more fabrication processes on the portion 802a in FIG. 8A. In some embodiments, the portion 902a may be an intermediate structure that is used to fabricate the portion 102a of FIG. 1A.

Figure 9B:
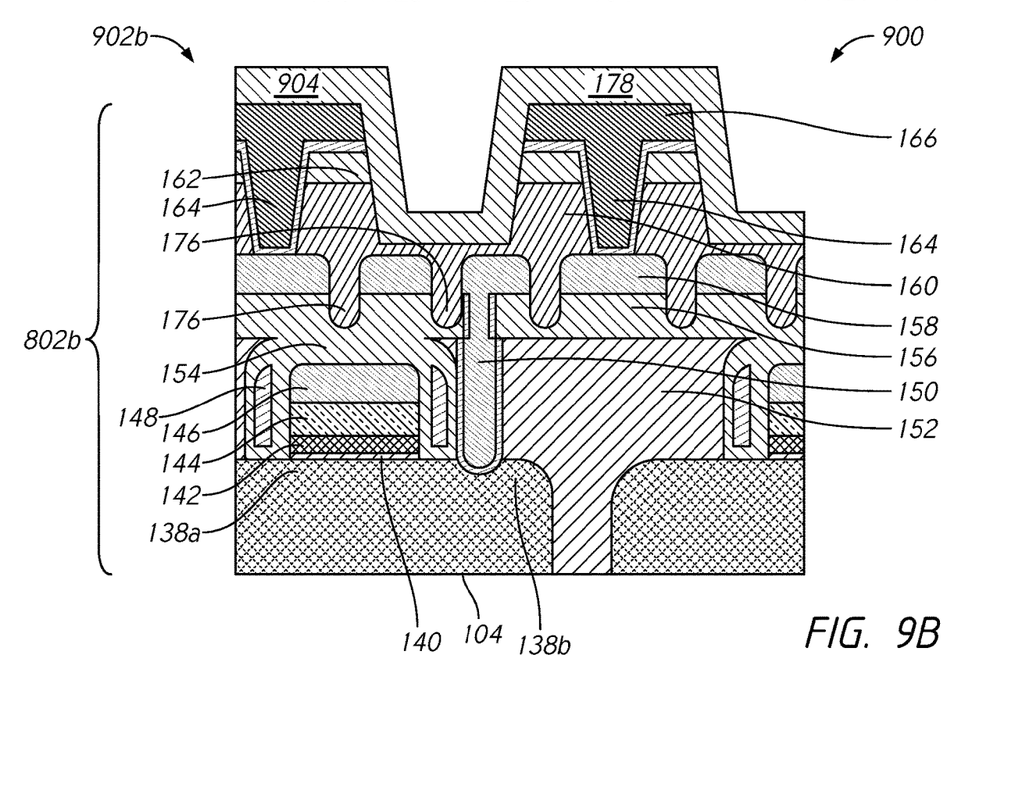
FIG. 9B is a diagram of a vertical cross-sectional view of a structure of another portion of the semiconductor device in accordance with the embodiment of FIG. 9A.

FIG. 9B is a diagram of a vertical cross-sectional view of a structure of a portion 902b of the semiconductor device 900 in accordance with the embodiment of FIG. 9A. In some embodiments, the portion 902b in FIG. 9B may be fabricated by performing one or more fabrication processes on the portion 802b in FIG. 8B. In some embodiments, the portion 902b may be an intermediate structure that is used to fabricate the portion 102b of FIG. 1B.

Dielectric material 904 may be deposited over the memory array region (not shown) and the peripheral region (not shown) of the semiconductor device 800. In some embodiments, the dielectric material 904 may be deposited using the ALD. In some embodiments, the dielectric material 904 may include silicon nitride ($Si_3N_4$). In the portion 902a, the dielectric material 134 that is a portion of the dielectric material 904 may be formed on the portion 802a. In the portion 902b, the dielectric material 178 that is another portion of the dielectric material 904 may be formed on the portion 802b. The dielectric material 904 may cover top surfaces of the interconnects 166, side walls of the interconnects 166, the hydrogen diffusion barrier layer 162 and the hydrogen source layer 160 and surfaces of the hydrogen source layer 160 exposed at bottoms of openings 804.

By providing a hydrogen source layer closer to active regions of a substrate, hydrogen atoms and/or molecules released from the hydrogen source layer in subsequent thermal processes may be diffused through conductive materials around transistors, and prevent leakage currents of around the transistors. Thus, data reliability and refresh rates of memory cells including the transistors may be improved. At the same time, by providing a hydrogen diffusion barrier layer above the hydrogen source layer, hydrogen diffusion effects above the hydrogen diffusion barrier layer (e.g., a capacitor's leakage currents due to chemical reduction of the high-k material) may be prevented.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or subcombination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. An apparatus, comprising:
   a substrate;
   an active region in the substrate;
   at least one first conductive material above the active region, the at least one first conductive material having hydrogen diffusion properties;
   a hydrogen source layer on the at least one first conductive material, the hydrogen source layer including hydrogen atoms and/or molecules, the hydrogen source layer configured to release the hydrogen atoms and/or molecules;
   a hydrogen diffusion barrier layer on the at least one first conductive material, the hydrogen diffusion barrier layer having hydrogen barrier properties;
   at least one second conductive material above the hydrogen diffusion barrier layer, the at least one second conductive material coupled to the at least one first conductive material;
   an opening through the hydrogen source layer and the hydrogen diffusion barrier layer; and
   a dielectric material on the opening to cover a surface of the hydrogen source layer exposed at the opening, the dielectric material having hydrogen barrier properties.

2. The apparatus of claim 1, wherein the hydrogen source layer is formed at a first temperature and the hydrogen diffusion barrier layer is formed at a second temperature that is higher than the first temperature, and
   wherein the hydrogen source layer is configured to release the hydrogen atoms and/or molecules responsive to the second temperature.

3. The apparatus of claim 1, further comprising a memory cell that includes:
   a transistor on the active region;
   a capacitor above the transistor; and
   a capacitor contact above the transistor and coupled to the capacitor, wherein the capacitor contact comprises a portion of the at least one first conductive material.

4. The apparatus of claim 1, further comprising a peripheral circuit that includes:
   a transistor on the active region; and
   a contact including a portion of the at least one first conductive material on the active region.

5. The apparatus of claim 1, further comprising:
   a via disposed on a portion of the at least one first conductive material and through the hydrogen source layer and the hydrogen diffusion barrier layer; and
   an interconnect disposed on the via and the hydrogen diffusion barrier layer,
   wherein the via comprises a first portion of the at least one second conductive material, and
   wherein the interconnect comprises a second portion of the at least one second conductive material.

6. The apparatus of claim 5, further comprising another via disposed on the interconnect.

7. The apparatus of claim 1, wherein the hydrogen atoms and/or molecules diffuse through the at least one first conductive material and reach the active region.

8. The apparatus of claim 7, wherein the hydrogen atoms and/or molecules diffuse through grain boundaries of the at least one first conductive material.

9. The apparatus of claim 7, wherein the hydrogen atoms and/or molecules diffuse through interfaces of the substrate and the at least one first conductive material.

10. The apparatus of claim 7, wherein the hydrogen atoms and/or molecules passivate dangling bonds in the substrate.

11. The apparatus according to claim 1, wherein the surface of the hydrogen source layer covered by the dielectric material includes parts of the surface of the hydrogen source layer exposed at a side wall and a bottom of the opening.

12. The apparatus according to claim 1, wherein the dielectric material on the opening further covers a surface of the hydrogen diffusion barrier layer exposed at the opening.

13. The apparatus according to claim 1, wherein the opening and the dielectric material are in a peripheral region.

14. The apparatus according to claim 1, further comprising a contact including the at least one first conductive material above the active region, wherein the hydrogen source layer and the opening are above the contact.

15. The apparatus of claim 1, wherein the dielectric material includes silicon nitride.

16. An apparatus, comprising:
    a substrate;
    an active region in the substrate;
    a contact above the active region, the contact comprising a conductive material having hydrogen diffusion properties;

a hydrogen source layer including a first dielectric material on the contact, the first dielectric material comprising hydrogen atoms and/or molecules;

a hydrogen diffusion barrier layer including a second dielectric material on the first dielectric material, the second dielectric material having hydrogen barrier properties;

an opening through the hydrogen source layer and the hydrogen diffusion barrier layer; and a third dielectric material on the opening to cover a surface of the hydrogen source layer exposed at the opening, the third dielectric material having hydrogen barrier properties.

17. The apparatus of claim 16, wherein the conductive material comprises at least one of copper (Cu), aluminum (Al), tungsten (W), or polycrystalline silicon (poly-Si).

18. The apparatus of claim 16, wherein the first dielectric material comprises at least one of a hydrogen-rich silicon nitride or a hydrogen alloy.

19. The apparatus of claim 16, wherein the second dielectric material comprises at least one of a crystal of silicon nitride ($Si_3N_4$), a metal configured to absorb a hydrogen, or an aluminum oxide ($Al_2O_3$).

20. The apparatus of claim 19, wherein the metal includes titanium (Ti).

21. The apparatus according to claim 16, further comprising another conductive material on the contact and at least through the first dielectric material.

* * * * *